United States Patent [19]

Mettler et al.

[11] Patent Number: 4,985,116

[45] Date of Patent: Jan. 15, 1991

[54] THREE DIMENSIONAL PLATING OR ETCHING PROCESS AND MASKS THEREFOR

[75] Inventors: John H. Mettler, North Haven; William L. Johnson, New Haven; William C. Strickland; Victor V. Zaderej, both of North Haven, all of Conn.

[73] Assignee: Mint-Pac Technologies, Inc., North Haven, Conn.

[21] Appl. No.: 484,387

[22] Filed: Feb. 23, 1990

[51] Int. Cl.[5] .................. B44C 1/22; C03C 15/00; C03C 25/06; C23F 1/02

[52] U.S. Cl. .................. 156/656; 156/643; 156/645; 156/659.1; 156/902; 156/212; 156/242; 156/277; 156/285; 156/345; 204/15; 204/38.4; 219/121.69; 427/96; 430/5; 430/313

[58] Field of Search .................. 219/121.68, 121.69, 219/121.85; 430/5, 313, 314, 315, 316, 318; 427/96, 98; 204/15, 20, 23, 38.4, 38.5, 38.7; 156/643, 656, 659.1, 666, 645, 212, 242, 277, 285, 902, 345; 428/195, 199; 29/846

[56] References Cited

U.S. PATENT DOCUMENTS

| | | | |
|---|---|---|---|
| 3,529,082 | 9/1970 | Hoesli | 178/6.5 |
| 4,029,006 | 6/1977 | Mercer | 101/35 |
| 4,120,330 | 10/1978 | Weismann | 140/112 |
| 4,233,754 | 11/1980 | Dubuit | 34/203 |
| 4,414,298 | 11/1983 | Krenz | 429/99 |
| 4,584,767 | 4/1986 | Gregory | 29/848 |
| 4,591,220 | 5/1986 | Impey | 339/17 M |
| 4,645,347 | 2/1987 | Rioux | 356/376 |
| 4,689,103 | 8/1987 | Elarde | 156/242 |
| 4,692,878 | 9/1987 | Ciongoli | 364/518 |
| 4,710,419 | 12/1987 | Gregory | 428/210 |
| 4,749,355 | 6/1988 | Hemmer | 439/63 |
| 4,764,849 | 8/1988 | Khan | 361/428 |
| 4,791,490 | 12/1988 | Knight et al. | 358/209 |

OTHER PUBLICATIONS

IPC-MB-380 Draft Standard, Performance Specifications for Molded Printed Boards, Jan., 1987.
"Electrophoretic Photoresist Technology: An Image of the Future Today", Vidusek, EPIC Winter Conference, Dec., 1988.
"Cast Spring"-A Plated, Molded Thermoplastic Electrical I/O Interface, Jack O'Brien, Connection Technology, Jun., 1989.
MINT-PAC Technologies Inc., "Solutios to Tomorrows Electronic Packaging Needs", summer 1989 promotional literature.

Primary Examiner—William A. Powell
Attorney, Agent, or Firm—Jerry A. Miller

[57] ABSTRACT

In a process for plating or etching metalization patterns on the surface of a three dimensional substrate, a flexible plastic mask is fabricated by first coating the surface of a thin plastic sheet with vacuum formable ink. The mask is then molded into the shape of the surface into which the pattern is to be formed. A low power YAG laser is used to remove areas of the ink through which light is to be allowed to pass. This mask may then be used in either a print and plate process or a print and etch process by drawing the mask into intimate contact with the workpiece by applying a vacuum between the mask and the workpiece. The workpiece may then be exposed to light through the clear areas of the mask.

38 Claims, 4 Drawing Sheets

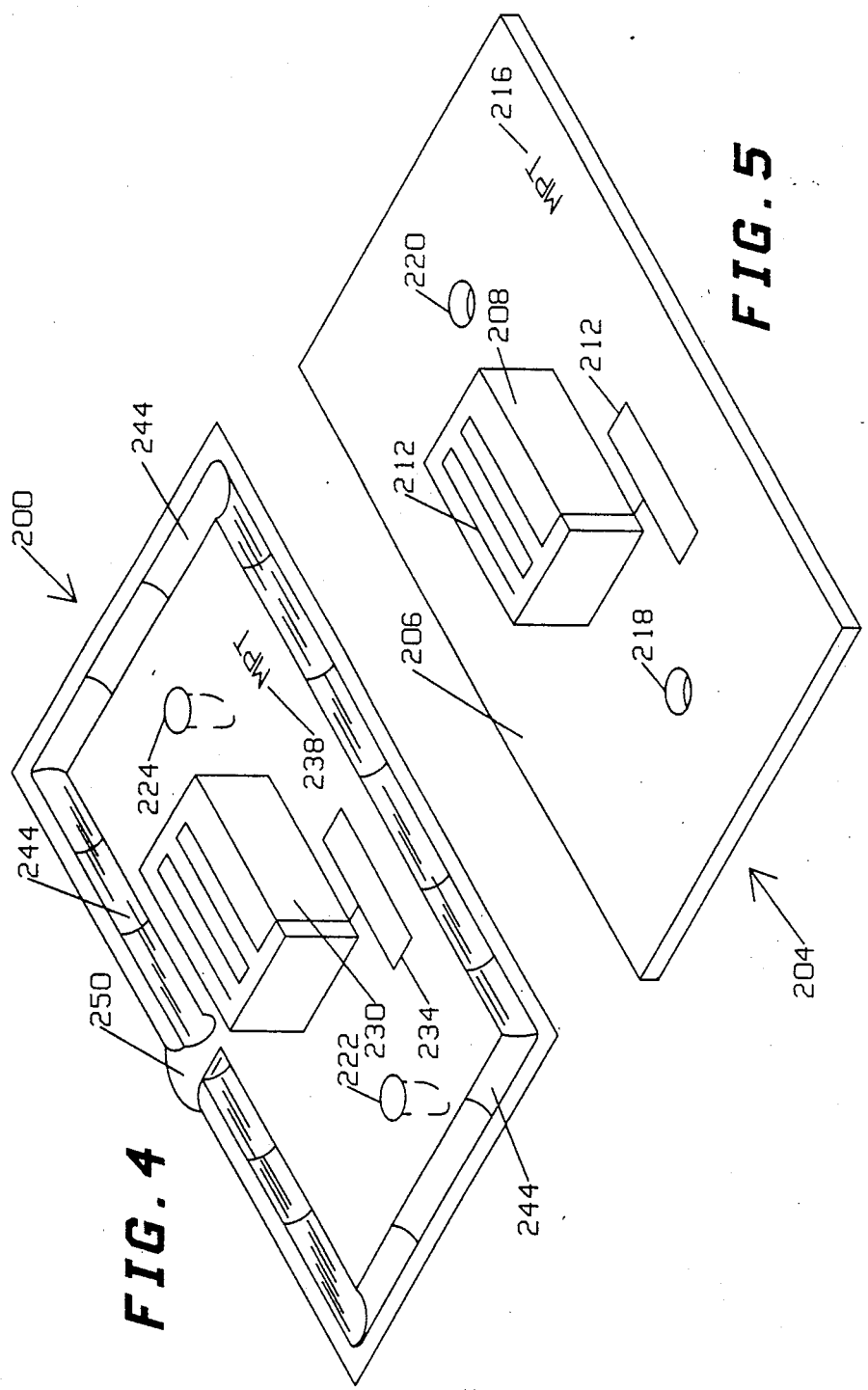

THREE DIMENSIONAL PLATING OR ETCHING PROCESS AND MASKS THEREFOR

CROSS REFERENCE TO RELATED APPLICATIONS

This application is related to the following patent applications filed simultaneously herewith which are incorporated herein by reference: "Plated Electrical Connectors", to Victor Zaderej et al., Ser. No. 07/484,579, filed Feb. 23, 1990, currently pending; "Plated D-Shell Connector", to Victor Zaderej et al., Ser. No. 07/484,391, filed Feb. 23, 1990, currently pending; "Audio Jack Connector", to Victor Zaderej et al., Ser. No. 07/484,229, filed Feb. 23, 1990, currently pending; and "Circuit Board Edge Connector", to Victor Zaderej et al., Ser. No. 07/484,421 filed Feb. 23, 1990, currently pending.

BACKGROUND

1. Field of the Invention

This invention relates generally to the field of plating or etching of three dimensional molded parts such as printed wiring boards or electrical connectors. More particularly, this invention relates to a method which can be used to plate or etch conductive patterns onto molded plastic parts to produce three dimensional circuit boards, electrical connectors and the like using a resilient laser etched mask.

2. Background of the Invention

While it has been possible to produce three dimensional plated or etched parts in the past, masks used in these plating and etching processes have always been rigid and usually made from machined metals. Typically, such masks were made of machined aluminum with the plating patterns machined into the surface of the mask. Such machined masks suffer from a number of problems including relatively poor line resolution limited by the precision with which the mask could be machined. This results in lines which are typically limited to about 0.020 inch line widths and 0.030 inch line spacings. In order to obtain higher circuit densities which are used for printed wiring board (PWB) applications, much narrower width and closer spacing is required.

It is also not possible to make certain patterns using machined masks. This is due to the inability of a machined mask to support isolated areas of mask material. That is, mechanical support must be provided for all portions of the mask.

Such machined masks are generally negative image masks in which material is only present in locations where metal patterns are to be removed (or not deposited) on the part. It is thus not usually possible to manufacture a positive image mask. This limits the manufacturing process to those using a negative image mask.

In addition, it is extremely difficult to manufacture a machined rigid mask which intimately contacts the surface of the part being plated under all reasonable extremes of manufacturing tolerance. This can further influence the sharpness of the lines and impair resolution and line density.

Other processes for producing molded plastic circuit board are disclosed in U.S. Pat. Nos. 4,584,767 and 4,710,419 both to Gregory and in U.S. Pat. No. 4,591,220 to Impey. None of these patents utilize the method or apparatus disclosed herein.

The above-described shortcomings with the prior art processes are ameliorated with the present process in which a flexible mask having opaque and clear areas are brought into intimate contact with the part being plated using a vacuum.

SUMMARY OF THE INVENTION

It is an object of the present invention to provide an improved method for plating or etching metal patterns on two or three dimensional surfaces.

It is another object of the present invention to provide an improved mask for performing two or three dimensional platings or etchings.

It is a further object to provide a method of making three dimensional masks.

It is an advantage of the invention that enhanced resolution and freedom of pattern design can be obtained over conventional rigid machined masks. Line width and spacing of 0.010 inch and even less may be reliably fabricated by use of the present method and apparatus.

These and other objects and advantages of the invention will become apparent to those skilled in the art upon consideration of the following description of the invention.

In a process according to an embodiment of the present invention for plating or etching metalization patterns on the surface of a three dimensional substrate, a flexible plastic mask is fabricated by first coating the surface of a thin plastic sheet with vacuum formable ink. The mask is then vacuum formed and annealed into the shape of the surface into which the pattern is to be formed. A low power YAG laser is used to remove areas of the ink through which light is to be allowed to pass. This mask may then be used in either a print and plate process or a print and etch process by drawing the mask into intimate contact with the workpiece by applying a vacuum between the mask and the workpiece. The workpiece may then be exposed to light through the clear areas of the mask.

A method for fabricating a mask, according to an embodiment of the present invention, includes the steps of coating one surface of a sheet of transparent vacuum moldable material with a vacuum formable ink; vacuum molding the sheet; and removing portions of the ink to reveal transparent areas of the mask. The removing step is carried out by illuminating the portions of the ink with a YAG laser in the preferred embodiment.

A method for fabricating a mask according to the present invention may include the steps of coating one surface of a sheet of transparent vacuum moldable material having thickness between 0.005 and 0.050 inch with a vacuum formable ink; vacuum molding the sheet; and removing portions of the ink to reveal transparent areas of the mask by illuminating the portions of the ink with a computer controlled YAG laser. The ink may be removed from the surface by illuminating the surface through the transparent material or from the inked surface of the sheet.

A mask for use in a plating or etching process to be carried out on a workpiece, includes, in one embodiment, a vacuum formed sheet of flexible transparent plastic carrying the approximate shape of a surface of the workpiece. A coating of an opaque material covers a portion of the sheet. At least one area of the sheet has the opaque material removed to expose transparent plastic. Registration points provide alignment between the mask and the workpiece. The sheet is preferably made of material approximately 0.005 to 0.050 inch in thickness and a vacuum port is provided for application of vacuum between the mask and the workpiece. A vacuum seal preferably surrounds the periphery of the mask.

A method for applying a mask to a workpiece, according to an embodiment of the present invention, for use in a plating or etching process, includes the steps of providing a flexible mask having a surface which conforms with a surface of the workpiece; registering the mask over the surface of the workpiece; and drawing the mask into close contact with the workpiece by applying a vacuum between the mask and the workpiece. The workpiece may be selectively exposed to non-collimated light from a non-collimated light source through the mask.

In another embodiment of the present invention, a method for producing plated metal patterns on a substrate, includes the steps of coating a plated substrate with photoresist; installing a flexible mask over the coated substrate; pulling the substrate and the mask into close contact by applying a vacuum between the substrate and the mask; and exposing the coated substrate to light through the mask. The mask includes transparent areas and opaque (black) areas. The transparent areas may correspond to areas where metal is to be on the workpiece or to areas where metal is not to be on the workpiece.

In another embodiment of the present invention, a method for printing and plating a substrate, comprises the ordered steps of molding an insulative substrate to a predetermined shape; annealing the insulative substrate; electroless plating the substrate with copper; electroplating the substrate with a photoresist material; drying and baking the photoresist material; installing a flexible mask over the substrate; pulling the flexible mask into close registration with the substrate by applying a vacuum between the mask and the substrate; exposing the substrate to non-collimated light through the mask; removing the mask from the substrate; developing the photoresist material to expose areas of plated substrate while covering other areas of plated substrate; electroplating the exposed areas of plated substrate with a conductive material which is then plated with a material such as Sn/Pb to act as an etch resist; stripping the photoresist to expose the other areas of plated substrate; and etching the other areas of plated substrate to remove the plating on the other areas.

In another embodiment of the present invention, a method for printing and etching a substrate, comprises the ordered steps of molding an insulative substrate to a predetermined shape; annealing the insulative substrate; electroless plating the substrate with copper; electroplating the substrate with a conductive material; electroplating the substrate with a light sensitive photoresist material; drying and baking the photoresist material; installing a flexible mask over the substrate; pulling the flexible mask into close registration with the substrate by applying a vacuum between the mask and the substrate; exposing the substrate to noncollimated light through the mask; removing the mask from the substrate; developing the photoresist material to expose areas of plated substrate etching the areas of plated substrate to remove the plating; and while covering other areas of plated substrate; stripping the photoresist which covers the remaining metalized areas of plated substrate.

According to an alternative method for fabricating a mask, the method includes the steps of: providing a sheet of transparent material which turns opaque when exposed to laser light of adequate intensity; forming the sheet of material into a predetermined shape; and exposing the formed sheet to laser light of adequate intensity to cause selected areas of the formed sheet to turn opaque.

The features of the invention believed to be novel are set forth with particularity in the appended claims. The invention itself, however, both as to organization and method of operation, together with further objects and advantages thereof, may be best understood by reference to the following description taken in conjunction with the accompanying drawing.

BRIEF DESCRIPTION OF THE DRAWING

FIG. 4 shows a simple example of a three dimensional flexible mask of the present invention.

FIG. 5 shows a simple three dimensional plated or etched circuit board made from the mask of FIG. 4.

DETAILED DESCRIPTION OF THE INVENTION

Figure 1:
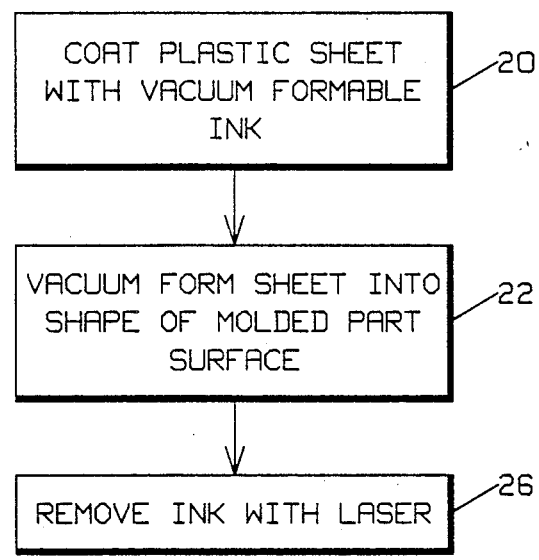
FIG. 1 shows a flow chart of the process of manufacturing a mask used in the present process.

Turning now to the drawing in which like reference numerals designate corresponding parts throughout the several figures thereof, and in particular to FIG. 1 thereof, the process of manufacturing a mask used in the process of the present invention is shown. The mask is made from a sheet of thin plastic material which is transparent to ultraviolet light in the preferred embodiment. Of course, other types of light may be used in alternative embodiments and those skilled in the art will appreciate that the material should be transparent to whatever type of light is later used to expose photoresist.

The plastic sheet may be made, for example, from 0.005 to 0.050 inch thick polycarbonate (PC) polyvinylchloride (PVC), polystyrene (PS) or polyethyleneterethalate (PET). The sheet may or may not be coated with a vacuum formable ink prior to forming the mask depending upon whether a positive or negative process is used. If the mask is to be mostly clear, it is preferably made of clear material which is not coated with ink. Darkened patterns may then be placed on the mask by any suitable technique. In one such technique, the mask may be made of acrylic and the patterns burned into the mask by a laser. Other materials besides acrylic may also be used.

The sheet is coated at step 20 with a vacuum formable ink if the mask is to have a negative image. This vacuum formable ink is preferably black in color but the only requirement is that it be opaque to the light which will later be used to expose photoresist through the mask and also be removable by the laser used to burn the traces into the mask, as will become clear later. The preferred black ink and is commercially available from Colonial Printing Ink Corp. under the trade name V.I.P. Gloss Ink.

This coated sheet is then vacuum formed at step 22 to a shape which corresponds to the surface of the finished part which is to bear the metalization pattern. This is done by forming the sheet over a mold having the same shape as a finished molded part. The mask should include adequate information to allow later registration with the molded part so that accurate etching or plating can occur. This is accomplished in the preferred embodiment by providing or defining two reference points to be used for alignment.

After the mask has been formed to the desired shape, a low power YAG laser (approximately 50 Watts or less has been found satisfactory) is used to remove the thin layer of dried ink from the surface of the mask. This is accomplished by computer controlling the laser in five degrees of freedom (that is, X, Y, Z, pitch and yaw). The laser can be controlled from data created using, for example, a computer aided drafting (CAD) program, such as AUTOCAD TM is commercially available from AutoDesk Corporation, in much the same manner that such data would be used to drive a plotter or computer controlled milling machine. Preferably, the starting location for the laser imaging of the surface of the mask is the same as the alignment points used to register the mask in order to minimize tolerance stack-up problems.

The mask is preferably made with the ink coating nearest to the surface of the three dimensional molded part. This is done to prevent scattering of the light as it passes through the plastic mask material to expose resist deposited on the part as will be described later. Otherwise, resolution would be impaired by this scattering resulting in 'fuzzy' lines and washed out images.

Similarly, it is advantageous that patterns be cut in the ink on the mask by laser by illuminating the mask with laser light from the ink side of the mask. However, the mask is preferably made of a material which is transparent to the laser light. This provides a mechanism for removing ink from the mask in areas which might be difficult to access from one side of the mask or the other. Although resolution might be less than optimal when the ink is removed by directing the laser beam through the mask material, in some circumstances, this is the best or only way to remove the ink due to a particular shape formed in the mask. Thus, ink can be removed from the mask either through the mask material or not as required.

In alternative forms of the present invention, an opaque positive image may be made on the transparent substrate by any suitable process such as painting, photographic processes and the like without departing from the present invention.

The completed mask should also preferably include a vacuum seal around it's periphery to facilitate drawing the mask into tight registration with the part to be etched or plated. A vacuum port is also provided at an appropriate location in the mask to allow the connection of a vacuum line to apply vacuum. These features will be illustrated in greater detail later.

It will be clear to those skilled in the art that there are many three dimensional shapes which will not permit either a rigid or a flexible mask to closely conform in all areas. Consider, by way of example, a shape such as that of a mushroom "growing" from a planer circuit board. Obviously, a mask as described cannot conform to the stem of the mushroom while still permitting the mask to be installed or removed over the cap of the mushroom. However, such a mask can be made to conform to the cap of the mushroom and extend straight downward in a cylinder surrounding but not closely registering with the stem. Although this type of mask will not be pulled into close registration with the stem, often it is the case that high resolution of traces is not needed in the stem area.

Consider next, for example, the circuit card edge connector described in the above incorporated patent application to Victor Zaderej entitled "Circuit Board Edge Connector". In this case, the cantilever spring fingers can be entirely coated with conductive metal. Only at the bases of the cantilevers must the mask provide for independence of the conductors leading to each cantilever. Thus, the mask used in fabricating this connector need only have a single recess into which all of the cantilevers are placed (or two recesses, one for each row of cantilevers). This facilitates ease of installation of the mask. Provision is then made at the base of the cantilevers to electrically isolate each of the cantilevers by having the mask extend between each cantilever at least near the base. In practice, this may be accomplished by surrounding each cantilever with mask material on the three outer sides while leaving the inner side free from mask contact.

There are two basic methods which can be used for producing traces upon three dimensional surfaces. These are referred to herein as a print and plate process and a print and etch process respectively. The print and plate process is described in conjunction with FIG. 2 while the print an etch process is described in conjunction with FIG. 3. In general, the processes described relate to forming traces or other metal patterns on a plastic molded three dimensional circuit board. But, portions of the process can be used for other processes or for other materials as well. In addition, the present mask can be used in conjunction with other print and plate processes and print and etch processes and is thus not limited to use with the present preferred processes.

Figure 2:
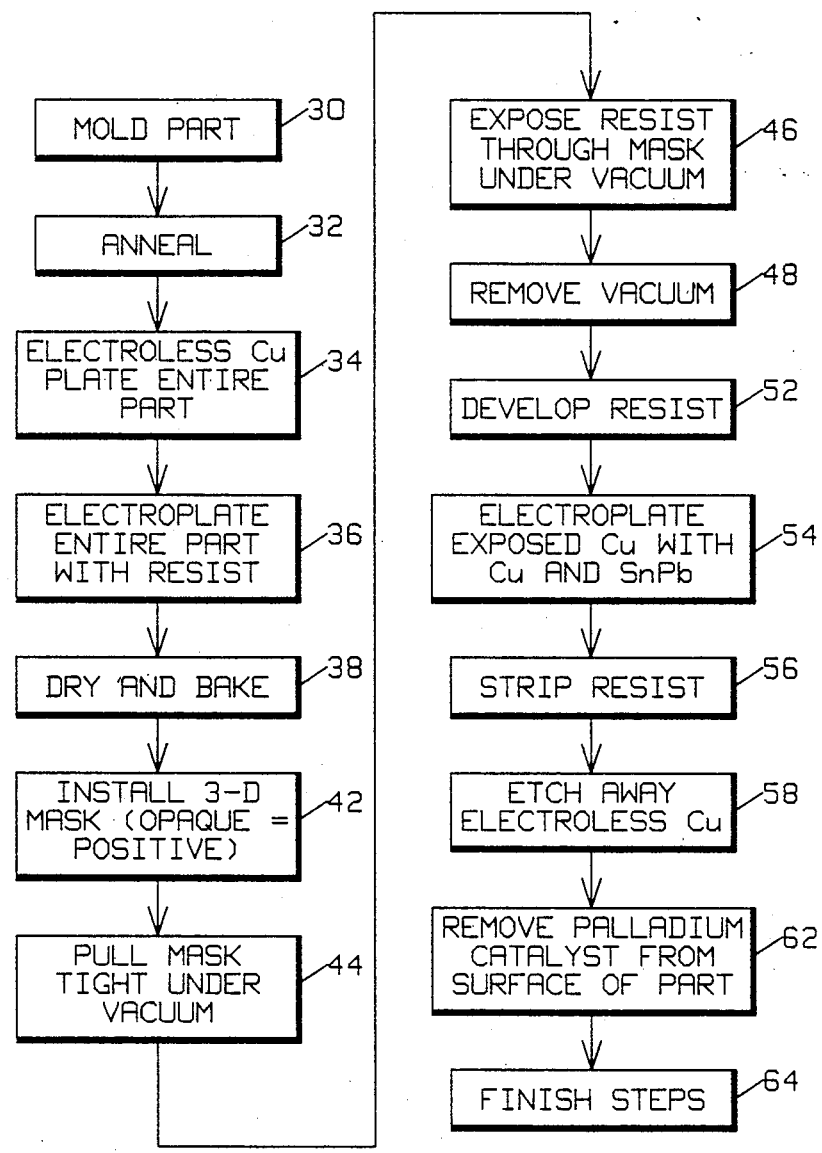
FIG. 2 shows a flow chart of a print and plate process using the present invention.

Turning now to FIG. 2, the print and plate process of the preferred embodiment is described beginning at step 30 where a three dimensional plastic substrate is molded in any of a number of conventional molding processes. This substrate can be made of any of a number of known materials such as polyetherimide, ABS or polycarbonate. If the material must later endure the heat of a soldering process, it should also be a high temperature plastic. Otherwise, the basic requirement is that it should be capable of plating. A plastic manufactured and available from General Electric Company under their trademark Ultem 2312 has been found especially suitable.

At step 32, the plastic molded parts are annealed, for example for about two hours at 170 degrees C., to remove stresses and bring the part to final dimension. The molded and annealed plastic part is then electroless plated over it's entire surface with copper using either a mechanical adhesion or a chemical bonding electroless plating process at step 34. The process and chemistry used for electroless plating of Ultem plastic is the chemical bonding process recommended by the manufacturer (General Electric Corporation) in readily available literature describing that company's products. Other processes may also be used with good results. It should be noted that this chemical bonding process leaves a residue of palladium catalyst on the surface of the plastic which must later be removed as directed by General Electric. Other processes for electroless plating may function equally well.

At step 36 the entire part is then coated with resist. This can be accomplished by, for example, electroplating an ultraviolet sensitive photoresist such as electrophoretic photoresist. This may be accomplished using the process described in "Electrophoretic Photoresist Technology: An Image of the Future—Today", by D.A. Vidusek, EIPC Winter Conference, December 1988, which is incorporated herein by reference. In some embodiments, spraying or dipping of the resist may prove satisfactory. The resist is then cured at step 38 as required depending on the resist used by, for example drying and baking. A flexible three dimensional mask as described in conjunction with FIG. 1 is then installed over the molded part at step 42 with opaque (black) areas of the mask corresponding to areas where metal will remain in the finished part. The mask is then pulled into tight registration with the molded part at step 44 by applying a vacuum to draw the mask and the part together.

The resist which is not masked by opaque areas of the mask is then exposed at step 46. This may be done by using a non-collimated ultraviolet light source while the molded part and the mask are being held in tight registration by the vacuum source. Next the vacuum is removed at step 48 and the mask is removed from the molded part. The resist is then developed at step 52 followed by electroplating the exposed copper with a conductive metal such as electrolytic Copper and tin or a tin/lead alloy (solder) at step 54. Other electroplated conductive materials may also be suitable. Next, areas of resist corresponding to those which are not electroplated are washed away with an appropriate stripper such as the commercially available resist stripper known as Hubbard Hall Resist Stripper 17 or equivalent at step 56.

At this point, the part contains areas of electroless plated copper and areas which have been electrolytic plated over the electroless plated copper. To complete the formation of metalization patterns, the exposed electroless plated copper is then etched away using, for example, a solution of Ammoniacal, Ferric Chloride, Peroxide—sulfuric, or cupric chloride etchant at step 58.

Finally, the palladium catalyst used during the electroless plating operation is cleaned from the surface of the part using an appropriate method and materials as recommended by and available from General Electric at step 62. At this point, the part is ready for any final processing such as gold or nickel plating, addition of pins, solder masking, etc. as required at step 64.

Figure 3:
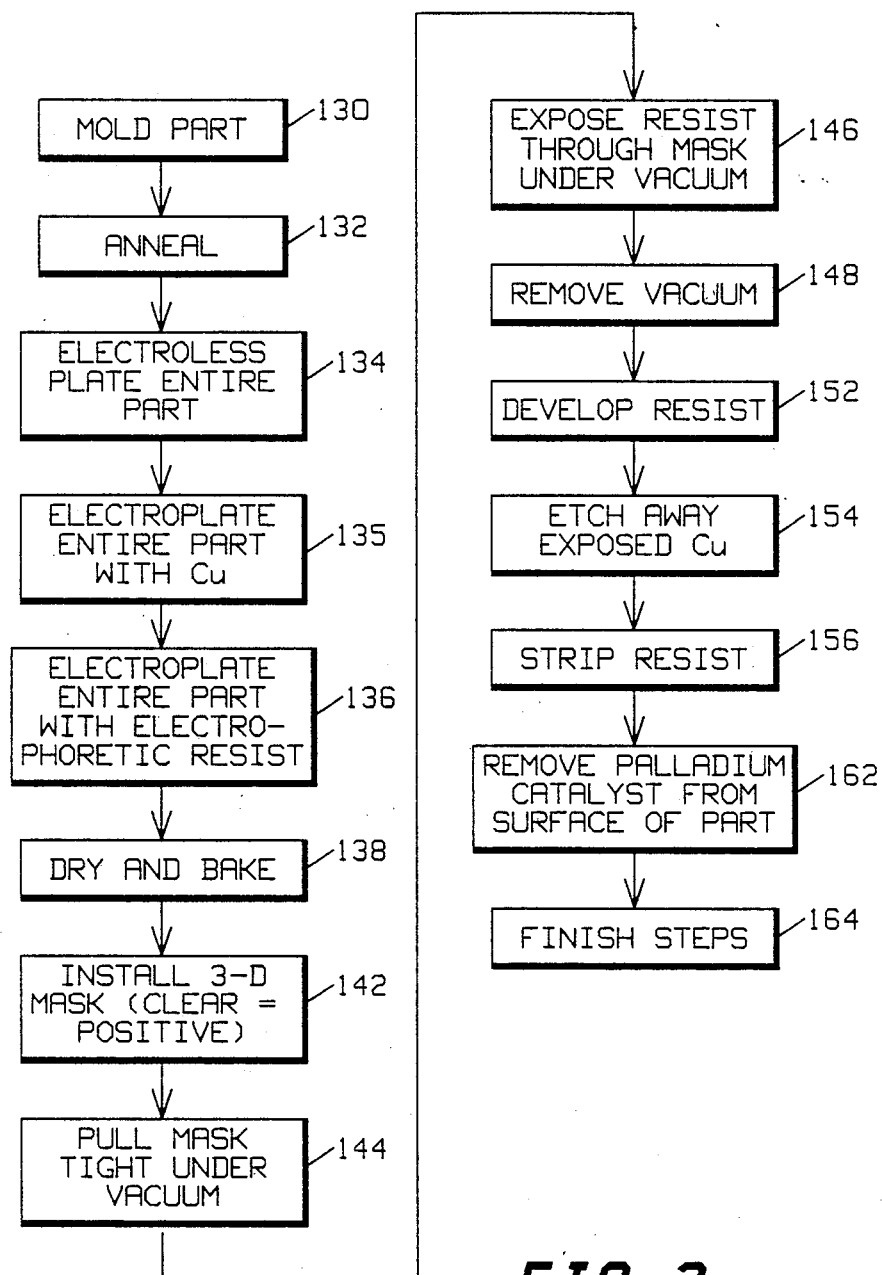
FIG. 3 shows a flow chart of a print and etch process using the present invention.

Turning now to FIG. 3, the print and etch process of the preferred embodiment is described. Analogous processes to those of FIG. 2 use the same or similar processes and materials as those described above. Beginning at step 130 where a three dimensional plastic substrate is molded in any of a number of conventional molding processes. This substrate can be made of any of a number of known materials such as polyetherimide, ABS or polycarbonate. If the material must later endure the heat of a soldering process, it should also be a high temperature plastic. Otherwise, the basic requirement is that it should be capable of plating. At step 132, the plastic molded parts are annealed to remove stresses and bring the part to final dimension. The molded and annealed plastic part is then electroless plated over it's entire surface with copper using either a mechanical adhesion or a chemical bonding electroless plating process at step 134. The entire part is then electroplated with copper at step 135.

At step 136 the entire part is then coated with resist. This can be accomplished by, for example, spraying, dipping or electroplating an ultraviolet sensitive photoresist such as electrophoretic photoresist. The resist is then cured at step 138 by, for example drying and baking. A flexible three dimensional mask as described in conjunction with FIG. 1 is then installed over the molded part at step 142 with opaque areas of the mask corresponding to areas where metal will be removed in the finished part. The mask is then pulled into tight registration with the molded part at step 144 by applying a vacuum to draw the mask and the part together.

The resist which is not masked by opaque areas of the mask is then exposed at step 146, for example by a non-collimated light source while the molded part and the mask are being held in tight registration by the vacuum source. Next the vacuum is removed at step 148 and the mask is removed from the molded part. The resist is then developed using an appropriate developing solution at step 152 followed by etching away the exposed copper as described previously at step 154. Next, areas of resist corresponding to those which are plated are washed away with an appropriate stripper at step 156. Finally, the palladium catalyst used during the electroless plating operation is cleaned from the surface of the part as described above at step 162.

At this point, the part is ready for any final processing or secondary operations such as gold or nickel plating, addition of pins, solder masking, etc. as required at step 164.

Turning now to FIG. 4, a simple example of a mask 200 manufactured by the process explained previously is shown. A resulting plated part 204 using this mask is shown in FIG. 5. In this simple example, a planar surface 206 contains an elevated block-shaped protrusion 208 which is to carry a plated conductor 212 from the planar surface, up the side of the block-shaped protrusion to its upper surface. In addition, plating is used to form an insignia 'MPT' 216 . Adjacent each end of the planar surfaces 206 are a pair of holes 218 and 220 passing through the planar surface which serve as registration points for the mask 200.

These registration points, in this simple example, correspond to dimples 222 and 224 which protrude downward from the mask 200 and engage the holes 218 and 220 respectively and help hold the mask in place and properly registered. A rectangular three dimensional bubble 230 in the mask corresponds to the block 208 in the molded substrate. The plated conductor 212 results from the corresponding trace 234 where ink has been cut away by the laser in the mask 200. Similarly, the 'MPT' insignia 216 is formed as a result of the ink removed in area 238 of the mask 200.

In general, square corners are somewhat difficult to achieve in the mask described, so preferably a suitable radius is provided on all square corners to permit the mask to closely mate with the molded part. While this simple example is described as having clear areas 230 and 238 which correspond to the resulting metal areas 212 and 216, this of course assumes a process wherein metal remains on the finished part in areas corresponding to the clear areas of the mask. Those skilled in the art will appreciate that a similar resultant metal pattern could be produced by a process wherein metal remains in areas corresponding to opaque parts of the mask.

Around the periphery of the mask 200 is an approximately semicircular channel 244 which forms a vacuum seal for enhanced vacuum efficiency. Vacuum is applied at a vacuum port 250 which protrudes through the seal and facilitates application of vacuum during the exposure of the workpiece through the mask.

Those skilled in the art will appreciate that there are many variations of the above invention including rearrangement of some of the process steps without departing from the present invention. Masks according to the present invention may be used for any suitable shadow mask related process. Additionally, this process may be used for fabricating a variety of products which might normally be made of metal or made as a separate part. For example, the above cross-referenced patent applications disclose a plurality of electrical connectors which are normally fabricated as assemblies of a variety of metal and plastic parts. By utilizing the present process, such parts may be fabricated as a part of an electronic PWB or as part of a plastic panel rather than requiring a separate assembly. Many other uses for the present process and mask will occur to those skilled in the art.

Thus it is apparent that in accordance with the present invention, an improved apparatus and method that fully satisfies the objectives, aims and advantages is set forth above. While the invention has been described in conjunction with specific embodiments, it is evident that many alternatives, variations, modifications and permutations will become apparent to those skilled in the art in light of the foregoing description. Accordingly, it is intended that the present invention embrace all such alternatives, variations, modifications and permutations as fall within the spirit and broad scope of the appended claims.

What is claimed as new and desired to be secured by Letters Patent is:

1. A method for fabricating a mask, comprising in combination the steps of:
    coating one surface of a sheet of transparent vacuum formable material with a vacuum formable ink;
    vacuum forming said sheet; and
    removing portions of said ink to reveal transparent areas of said mask.

2. The method of claim 1, wherein said removing step is carried out by illuminating said portions of said ink with a low power laser.

3. The method of claim 2, wherein said laser is a YAG laser.

4. The method of claim 1, wherein said sheet is approximately 0.005 to 0.050 inch in thickness.

5. The method of claim 2, wherein said ink is removed from said surface by illuminating said surface through said transparent material.

6. The method of claim 2, wherein said ink is removed from said surface by illuminating said surface from the inked surface of said sheet.

7. The method of claim 2, wherein said laser comprises a computer controlled laser.

8. The method of claim 7, wherein said laser can be controlled with five degrees of freedom.

9. The method of claim 2, wherein said laser has a power output of less than about 50 watts.

10. A method for fabricating a mask, comprising in combination the steps of:
    coating one surface of a sheet of transparent vacuum formable material having thickness between 0.005 and 0.050 inch with a vacuum formable ink;
    vacuum forming said sheet; and
    removing portions of said ink to reveal transparent areas of said mask by illuminating said portions of said ink with a low power computer controlled YAG laser.

11. The method of claim 10, wherein said ink is removed from said surface by illuminating said surface through said transparent material.

12. The method of claim 10, wherein said ink is removed from said surface by illuminating said surface from the inked surface of said sheet.

13. A mask for use in a plating or etching process to be carried out on a workpiece, comprising in combination:
    a vacuum formed sheet of flexible transparent plastic carrying the approximate shape of a surface of said workpiece;
    a coating of an opaque material covering a portion of said sheet;
    at least one area of said sheet having an absence of said opaque material to expose transparent plastic; and
    registration means for providing alignment between said mask and said workpiece.

14. The mask of claim 13, wherein said sheet is made of material approximately 0.005 to 0.050 inch in thickness.

15. The mask of claim 13, further comprising a vacuum port for application of vacuum between said mask and said workpiece.

16. The mask of claim 13, further comprising a vacuum seal surrounding a periphery of said mask.

17. The mask of claim 13, wherein said registration means comprises at least one dimple adapted to seat within an aperture in said workpiece.

18. The mask of claim 13, wherein said plastic is transparent to ultraviolet light.

19. A method for applying a mask to a workpiece for use in a plating or etching process, the method comprising in combination the steps of:
    providing a flexible mask having a surface which conforms with a surface of said workpiece;
    registering said mask over said surface of said workpiece; and
    drawing said mask into close contact with said workpiece by applying a vacuum between said mask and said workpiece.

20. The method of claim 19, further comprising the step of selectively exposing said workpiece to light through said mask.

21. The method of claim 20, wherein said light is produced by a non-collimated light source.

22. A method for processing a substrate, comprising in combination the steps of:
    coating a plated substrate with photoresist;
    installing a flexible mask over said coated substrate;
    pulling said substrate and said mask into close contact by applying a vacuum between said substrate and said mask; and
    exposing said coated substrate to light through said mask.

23. The method of claim 22, wherein said mask includes transparent areas and opaque areas, and wherein said transparent areas correspond to areas where metal is to be on said substrate.

24. The method of claim 22, wherein said mask includes transparent areas and opaque areas, and wherein said transparent areas correspond to areas where metal is to be removed from said workpiece.

25. The method of claim 22, further comprising the step of developing said exposed resist coated substrate to expose conductive areas.

26. The method of claim 22, wherein said light is non-collimated light.

27. The method of claim 22, further comprising the steps of electroless plating an insulating substrate prior to said coating step to produce said plated substrate.

28. The method of claim 27, further comprising the step of electroplating said electroless plated substrate with a conductive metal prior to said coating step to produce said plated substrate.

29. The method of claim 25, further comprising the step of electroplating said exposed conductive areas with a conductive material.

30. The method of claim 25, further comprising the step of etching away said exposed conductive areas.

31. The method of claim 25, further comprising the step of stripping away said developed resist.

32. The method of claim 31, further comprising the step of etching away conductive material exposed by the step of stripping away said developed resist.

33. The method of claim 31, further comprising the step of cleansing said substrate to remove a catalyst therefrom.

34. A method for printing and plating a substrate, comprising the ordered steps of:
   molding an insulative substrate to a predetermined shape;
   annealing said insulative substrate;
   electroless plating said substrate with copper;
   electroplating said substrate with a photoresist material;
   drying and baking said photoresist material;
   installing a flexible mask over said substrate;
   pulling said flexible mask into close registration with said substrate by applying a vacuum between said mask and said substrate;
   exposing said substrate to non-collimated light through said mask;
   removing said mask from said substrate;
   developing said photoresist material to expose areas of plated substrate while covering other areas of plated substrate;
   electroplating said exposed areas of plated substrate with a conductive material;
   etching said other areas of plated substrate to remove said plating on said other areas; and
   stripping said photoresist to expose said other areas of plated substrate.

35. A method for fabricating a mask, comprising in combination the steps of:
   providing a sheet of transparent material which turns opaque when exposed to laser light of adequate intensity;
   forming said sheet of material into a predetermined shape; and
   exposing said formed sheet to laser light of adequate intensity to cause selected areas of said formed sheet to turn opaque.

36. The method of claim 35, wherein said sheet of material is made of acrylic and wherein said laser burns opaque patterns in said selected areas.

37. A method for printing and etching a substrate, comprising the ordered steps of:
   molding an insulative substrate to a predetermined shape;
   annealing said insulative substrate;
   electroless plating said substrate with a conductive material;
   electroplating said substrate with a conductive material; electroplating said substrate with a photoresist material;
   drying and baking said photoresist material;
   installing a flexible mask over said substrate;
   pulling said flexible mask into close registration with said substrate by applying a vacuum between said mask and said substrate;
   exposing said substrate to non-collimated light through said mask;
   removing said mask from said substrate;
   developing said photoresist material to expose areas of plated substrate while covering other areas of plated substrate;
   etching away said exposed areas of plated substrate; and
   stripping said photoresist to expose said other areas of plated substrate.

38. The method of claim 35, wherein said laser burns opaque patterns in said selected areas.

* * * * *